US009349620B2

(12) United States Patent
Kamata et al.

(10) Patent No.: US 9,349,620 B2
(45) Date of Patent: May 24, 2016

(54) APPARATUS AND METHOD FOR PRE-BAKING SUBSTRATE UPSTREAM OF PROCESS CHAMBER

(71) Applicant: ASM IP Holding B.V., Almere (NL)

(72) Inventors: Keisuke Kamata, Nagaoka (JP);
Hiroyuki Sato, Nagaoka (JP); Kazunori Furukawahara, Nagaoka (JP); Masaei Suwada, Nagaoka (JP); Kenkichi Okubo, Nagaoka (JP); Izumi Arai, Nagaoka (JP)

(73) Assignee: ASM IP Holdings B.V., Almere (NL)

( * ) Notice: Subject to any disclaimer, the term of this patent is extended or adjusted under 35 U.S.C. 154(b) by 155 days.

(21) Appl. No.: 14/327,134

(22) Filed: Jul. 9, 2014

(65) Prior Publication Data

US 2016/0013084 A1 Jan. 14, 2016

(51) Int. Cl.
 *F26B 11/00* (2006.01)
 *H01L 21/67* (2006.01)
 *H01L 21/677* (2006.01)
 *F27B 9/12* (2006.01)

(52) U.S. Cl.
 CPC .... *H01L 21/67109* (2013.01); *H01L 21/67775* (2013.01); *H01L 21/67778* (2013.01); *F27B 2009/124* (2013.01)

(58) Field of Classification Search
 CPC .......... F26B 11/00; F26B 19/00; F26B 21/00; F26B 21/06; H01L 21/00; H01L 21/67109; H01L 21/67248; F27B 2009/124; C23C 16/00
 USPC ............ 34/476, 201, 210, 218, 235; 118/715, 118/725
 See application file for complete search history.

(56) References Cited

U.S. PATENT DOCUMENTS

| 3,094,396 | A | * | 6/1963 | Flugge | F26B 15/04 34/105 |
| 5,577,331 | A | * | 11/1996 | Suzuki | F26B 5/08 34/58 |
| 5,621,982 | A | * | 4/1997 | Yamashita | F28B 21/14 34/203 |
| 5,724,748 | A | * | 3/1998 | Brooks | B65D 81/20 206/213.1 |
| 5,852,879 | A | * | 12/1998 | Schumaier | A61L 2/07 34/218 |
| 6,134,807 | A | * | 10/2000 | Komino | H01L 21/67034 34/418 |
| 6,212,789 | B1 | * | 4/2001 | Kato | H01L 21/67051 134/902 |
| 6,325,858 | B1 | * | 12/2001 | Wengert | C23C 16/4401 118/715 |
| 6,760,981 | B2 | * | 7/2004 | Leap | F26B 15/18 34/210 |
| 6,874,247 | B1 | * | 4/2005 | Hsu | F26B 9/003 219/242 |

(Continued)

FOREIGN PATENT DOCUMENTS

| JP | 2012146939 A | * | 8/2012 | |
| KR | 102008052750 A1 | * | 6/2009 | ........ C23C 16/45504 |
| KR | 20100020834 A | * | 2/2010 | |

*Primary Examiner* — Stephen M Gravini
(74) *Attorney, Agent, or Firm* — Snell & Wilmer LLP

(57) ABSTRACT

A pre-baking apparatus for heating a substrate upstream of a process tool is adapted to be connected to an EFEM (equipment front end module) and includes: a chamber which has a front face with multiple slots arranged in a height direction of the chamber, and which is divided into multiple compartments extending from the multiple slots, respectively, toward a rear end of the chamber for loading and unloading substrates; and a connecting frame for connecting the chamber to the process tool. The multiple compartments are separated from each other by a divider plate and provided with heaters for heating the multiple compartments, and each compartment has a gas injection port for blowing a hot inert gas over the substrate placed therein toward the slot.

20 Claims, 8 Drawing Sheets

(56) References Cited

U.S. PATENT DOCUMENTS

| | | | |
|---|---|---|---|
| 7,992,318 B2* | 8/2011 | Kawaji | H01L 21/67109 118/58 |
| 8,020,315 B2* | 9/2011 | Nishimura | H01L 21/02052 118/666 |
| 8,393,091 B2* | 3/2013 | Kawamoto | H01L 21/02057 134/21 |
| 9,171,714 B2* | 10/2015 | Mori | H01L 21/0206 |
| 2004/0016637 A1* | 1/2004 | Yang | A23D 7/00 204/242 |
| 2008/0257494 A1 | 10/2008 | Hayashi et al. | |
| 2011/0143461 A1 | 6/2011 | Fish et al. | |

* cited by examiner

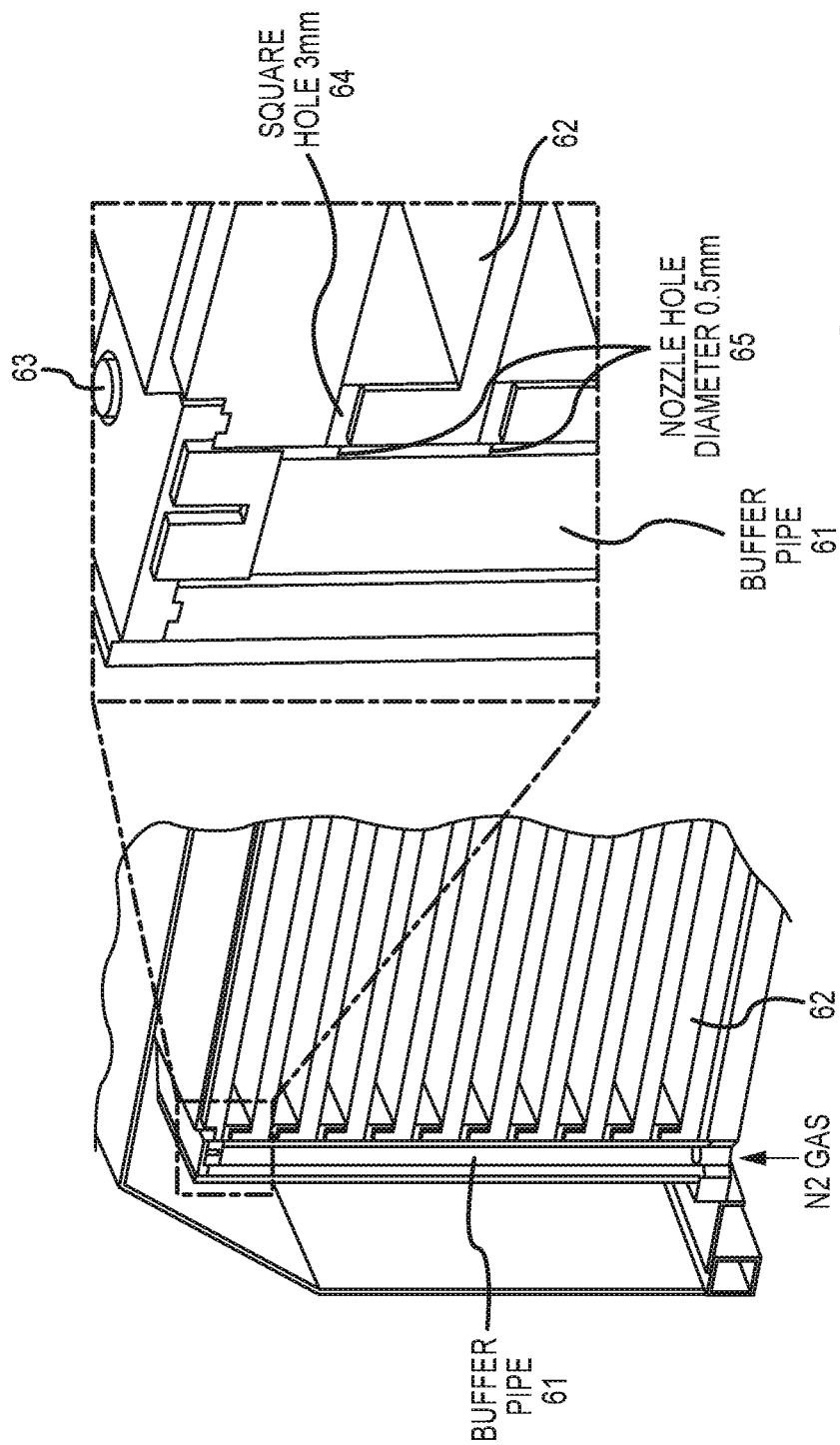

APPARATUS AND METHOD FOR PRE-BAKING SUBSTRATE UPSTREAM OF PROCESS CHAMBER

BACKGROUND OF THE INVENTION

1. Field of the Invention

The present invention generally relates to an apparatus and method for pre-baking a substrate such as a semiconductor wafer upstream of a process chamber, wherein the pre-baking is conducted to remove moisture from a film such as a resist film before processing the film.

2. Description of the Related Art

In order to bake out moisture, etc. from a film (such as a film including a resist film), after loading a wafer to a process chamber, the film is pre-baked and degassed before processing the wafer in the process chamber. Since the process chamber is used for the pre-baking and degassing process, regardless of the type of the process chamber (a single-wafer reactor or batch reactor), a wafer run rate or throughput is decreased due to the time used for pre-baking and degassing in the process chamber. Further, since the process chamber is controlled at a low pressure, and thermal conductivity and transfer are low under a reduced pressure, heating in the reduced pressure is not as efficient as in atmospheric pressure, requiring a longer time to raise and control the temperature. This also contributes to a reduction of wafer run rate or throughput.

An object of the present invention is to conduct pre-baking without suffering a throughput reduction.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

The mainstay of semiconductor automation is shuttling products (e.g., silicon wafers or quartz photo-masks) between ultra-clean storage carriers and a variety of process tools (e.g., processing, measurement, or testing chambers) through an equipment front end module (EFEM). In some embodiments to solve at least one of the above-discussed problems, pre-baking is conducted substantially at an atmospheric pressure in an EFEM area, not in a process chamber. In some embodiments, a pre-baking station is provided in a mini environment in the EFEM area. In some embodiments, the pre-baking station has a BOLTS interface (Box Opener/Loader-to-Tool Standard Interface; mechanical interface), not at a wafer cooling stage location, so that the pre-baking station can be installed universally in all tools. Alternatively, the pre-baking station can be installed at a wafer cooling stage location by replacing a cooling station with the pre-baking station if the system need not have a cooling stage. In some embodiments, in order to increase the wafer run rate, a heating up period is made short by providing multi-stage heating slots in the pre-baking station, wherein multiple wafers stored in respective slots are heated simultaneously. In some embodiments, also in order to efficiently heat wafers so as to shorten a time to heat up wafers and accelerate degassing, hot nitrogen injection ports are provided in the pre-baking station to blow hot nitrogen gas along wafers stored in the pre-baking station. In some embodiments, a wafer is sandwiched or inserted between heating media (e.g., heated aluminum plates) so that the wafer is heated from both top and bottom, thereby shortening a heating up period as compared with heating equipment of general multi-slot-type ovens.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 5 consists of (a) a schematic cross sectional view of a chamber of a pre-baking apparatus, and (b) a schematic enlarged cross sectional view of the area surrounded by a square indicated in (a) according to an embodiment of the present invention.

DETAILED DESCRIPTION OF EMBODIMENTS

Figure 1:
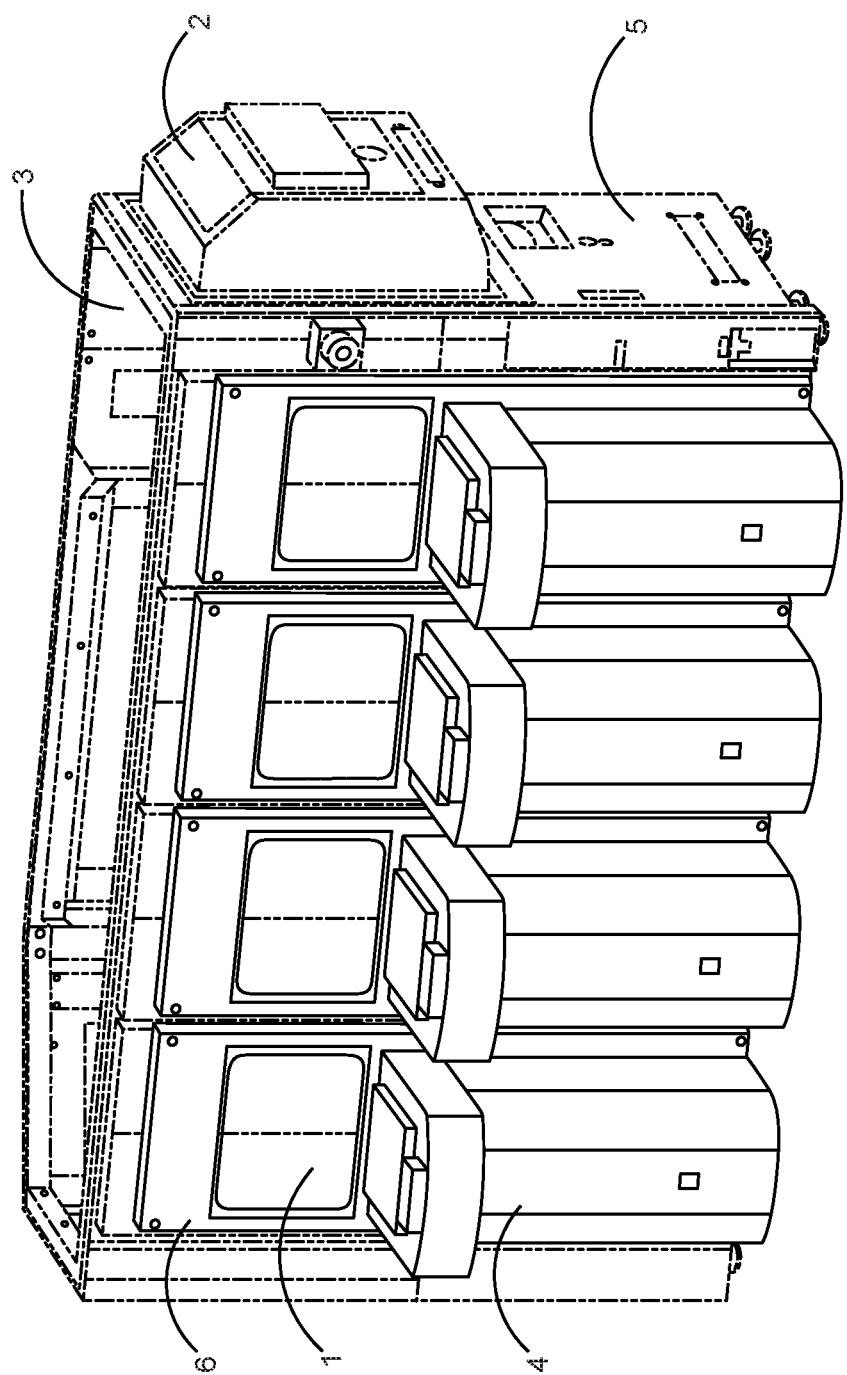
FIG. 1 is a schematic view of an EFEM (equipment front end module) area for a process tool.

In this disclosure, "gas" may include vaporized solid and/or liquid and may be constituted by a single gas or a mixture of gases. Likewise, an article "a" or "an" refers to a species or a genus including multiple species. Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. The term "constituted by" refers to "comprising", "consisting essentially of", or "consisting of" in some embodiments. The term "connected" refers to direct connection without any intervening parts or indirect connection with an intervening part, and includes physical, electrical, and functional connection in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, "pre-baking" refers to a process conducted upstream of a process tool and prior to the subsequent target process of a substrate in a process chamber, in order to remove moisture from a film formed on a substrate, degas (remove unwanted or excess gas from) a film formed on a substrate, etc. as a preliminary step for the target process of the substrate. Typically, unlike "curing," the "pre-baking" does not substantially involve a chemical reaction (such as polymerization or crosslinking), and unlike "annealing," the "pre-baking" does not substantially involve replacing or forming a terminal group (such as replacement of an alcohol group and hydroxyl group with a Si-Me group or formation of a Si—O bond).

An embodiment of the present invention provides a pre-baking apparatus for heating a substrate upstream of a process tool, comprising: (i) a chamber which has a front face with multiple slots arranged in a height direction of the chamber, each slot extending from side to side, and which is divided into multiple compartments extending from the multiple slots, respectively, toward a rear end of the chamber for loading and unloading substrates to and from the multiple compartments through the multiple slots, said multiple compartments being separated from each other by a divider plate and provided with heaters for heating the multiple compartments, each compartment having a gas injection port for blowing a hot inert gas over the substrate placed therein toward the slot; and (ii) a connecting frame for connecting the chamber to the process tool. According to the above configurations, efficient pre-baking can be conducted.

In some embodiments, the connecting frame is configured to connect the chamber to an EFEM (equipment front end module) connected to the process tool. By installing the pre-baking apparatus in the EFEM, because of the specific configurations of the pre-baking apparatus and because the pre-baking can be conducted in parallel with the main process sequence (the pre-baking process can be applied to a cascade loading pattern, i.e., simultaneous loading of wafers to various chambers) and also the pre-baking can be conducted under standard atmospheric pressure, a wafer run rate (the number of wafers processed per hour) or throughput can significantly be improved. In some embodiments, the connecting frame has a structure to be attached to an interface for mechanically attaching a load port to the EFEM. In some embodiments, the pre-baking apparatus is modularized and operable independently of the EFEM. In some embodiments, the pre-baking apparatus further comprises a control unit including a gas supply system for heating an inert gas upstream of the gas injection ports and supplying the heated inert gas as the hot inert gas to the gas injection ports. In some embodiments, the control unit is disposed under the chamber and has casters at a bottom of the control unit. In some embodiments, the chamber is not capable of processing the substrate other than pre-baking by the heaters and the hot inert gas. Accordingly, the pre-baking apparatus can readily be retrofitted to the EFEM, facilitating connection to the EFEM.

In this disclosure, the "EFEM" is a module or section used in semiconductor automation for shuttling product (silicon wafers or quartz photo-masks) between ultra-clean storage carriers and a variety of processing, measurement and testing systems, for example, and contains components needed to unload a product, deliver it to a parent tool for processing, and return the product to its carrier upon completion, for example. The processing includes, but is not limited to, depositing a film, etching, ashing, curing, etc. by plasma-assisted, thermal, or radical processing, or the like (e.g., plasma-enhanced CVD, thermal CVD, cyclic CVD, plasma-enhanced ALD, thermal ALD, radical-enhanced ALD, or any other thin film deposition methods). In some embodiments, the EFEM includes a minienvironment which is a zone within a cleanroom that has a higher level of cleanliness than the rest of the cleanroom. It is usually separated by a physical barrier and can be: integral to the cleanroom, separated by hard or soft wall, or a modular cleanroom inside an existing larger cleanroom.

In some embodiments, each compartment is provided with a substrate support on which the substrate is placed in a manner allowing the hot inert gas to flow over both a top side and a reverse side of the substrate. Since both sides of the substrate are heated, the substrate can efficiently be heated. In some embodiments, the duration of pre-baking may be about 240 seconds to about 300 seconds (generally, upper slots require less time than lower slots), as compared with 360 seconds by a conventional oven.

In some embodiments, each compartment is defined by adjacent upper and lower divider plates, side walls, and a rear wall opposite to the slot, wherein the gas injection port is disposed in a center of the rear wall. The divider plate can function as a heating medium radiating heat, increasing the heating efficiency. In some embodiments, the multiple compartments have multiple holes formed in the height direction through the side walls and through the rear wall, wherein a cartridge heater is inserted in each hole. In some embodiments, the holes formed through the side walls are disposed only near the front face in the side walls. In some embodiments, the pre-baking apparatus further comprises a gas manifold extending in the height direction of the chamber, from which gas manifold the hot inert gas is supplied to each compartment through each gas injection port. In some embodiments, the inert gas is heated by passing through a heat exchanger before being supplied to the gas manifold. The heat exchanger may be installed in a control unit of the pre-baking apparatus.

In some embodiments, the compartment has a depth sufficient to place the substrate entirely inside the compartment so that the substrate can efficiently be heated.

In some embodiments, the pre-baking apparatus further comprises an exhaust duct disposed at a bottom of the chamber and projecting in a direction perpendicular to the front face in a manner discharging through the exhaust duct the hot inert gas flowing out of the multiple slots.

Another embodiment of the present invention provides an EFEM (equipment front end module) area for a process tool for processing substrates, comprising: (a) a minienvironment which is a zone cleaner than a cleanroom and is configured to be connected to the process tool, said minienvironment having interfaces for mechanically attaching thereto at least one load port with a FOUP (front opening unified pod) for storing unprocessed and processed substrates and a cooling station for cooling substrates before storing processed substrates in the FOUP; (b) a load port with a FOUP mechanically attached to one of the interfaces; and (c) at least one of any of the foregoing pre-baking apparatuses mechanically attached to another of the interfaces.

In some embodiments, the interfaces include two or more interfaces each for mechanically attaching one load port with a FOUP to the minienvironment and one interface for mechanically attaching a cooling station to the minienvironment, wherein the load port is attached to one of the two or more interfaces, and the pre-baking apparatus is attached to another of the two or more interfaces, and the EFEM area further comprises a cooling station attached to the interface for a cooling station.

Still another embodiment of the present invention provides a method for processing a substrate using a process tool with any one of the foregoing EFEM areas, said method comprising: (I) taking out a substrate from the FOUP to the minienvironment; (II) inserting the substrate into the pre-baking apparatus to pre-bake the substrate, wherein the compartments of the pre-baking apparatus are heated and a hot inert gas blows through the compartments toward the minienvironment; (III) inserting the pre-baked substrate into the process tool via the minienvironment; (IV) processing the pre-baked substrate in the process tool; and (V) placing the processed substrate in the FOUP or another FOUP via the minienvironment.

In some embodiments, a cooling station is attached to the EFEM area and the method further comprises inserting the processed substrate into the cooling station before placing the processed substrate in the FOUP or another FOUP.

In some embodiments, the hot inert gas blowing through the pre-baking apparatus is $N_2$ gas flowing at a flow rate of about 10 slm to about 40 slm (standard liter/minute) and being heated to about 50° C. to about 150° C. In some embodiments, the compartments of the pre-baking apparatus are heated to about 50° C. to about 150° C.

In some embodiments, the pre-baking may be conducted under conditions indicated in Table 1 below.

TABLE 1

(the numbers are approximate)

| | Preferable | Typical |
|---|---|---|
| Temperature of a chamber set for pre-baking | 75° C. to 130° C. (for e.g., avoiding photoresist burnout) | 100° C. |
| Type of gas blowing into the chamber for pre-baking | Inert gas which is, $N_2$, Ar, He, Ne, etc. | $N_2$ |
| Flow rate of pre-baking gas | 0 SLM to 50 SLM | 30 SLM |
| Temperature of pre-baking gas | 100° C. to 140° C. | 100° C. |
| Duration of pre-baking process | 100 to 350 seconds (upper slots require less time than lower slots) | 200 to 300 seconds |
| Process for pre-baking | 1 atm to 1 atm + 3 Pa | Standard atmospheric pressure |

The embodiments will be explained with respect to preferred embodiments. However, the present invention is not limited to the preferred embodiments FIG. 1 is a schematic view of a typical EFEM (equipment front end module) area for a process tool. A process tool (not shown) is to be provided behind the EFEM represented by two-dot chain lines in this drawing. The EFEM is provided with a minienvironment 3 which is a zone cleaner than a cleanroom and is configured to be connected to the process tool. The minienvironment has BOTLS interfaces (Box Opener/Loader-to-Tool Standard Interfaces) for mechanically attaching thereto load ports 6 with FOUPs (front opening unified pods) (not shown) for storing unprocessed and processed substrates, and a cooling station 2 for cooling substrates before storing processed substrates in the FOUPs. Each FOUP is installed on a table provided on top of a control unit 4, facing an opening 1. The minienvironment 3 has a door 5 to access the inside thereof. The present invention can be applied to any other suitable types of EFEM. In this embodiment, there are four BOLTS interfaces provided in the EFEM; however, the number of the BOLTS interfaces is not limited and can be selected according to the size of the EFEM, etc. In some embodiments, one of the load ports 6 is replaced with a pre-baking station which is mechanically attached to the BOLTS interface. Since the pre-baking station is adapted to be connected to the BOLTS interface of the EFEM, it can be attached to various types of EFEM simply by replacing the load port therewith.

The cooling station is installed in order to cool a processed substrate before loading it to the FOUP depending on the heat resistant temperature of a material constituting the FOUP. If the heat resistant temperature of the FOUP is sufficient, the pre-baking apparatus can replace the cooling station 2 attached to an interface of the EFEM.

Figure 2C:
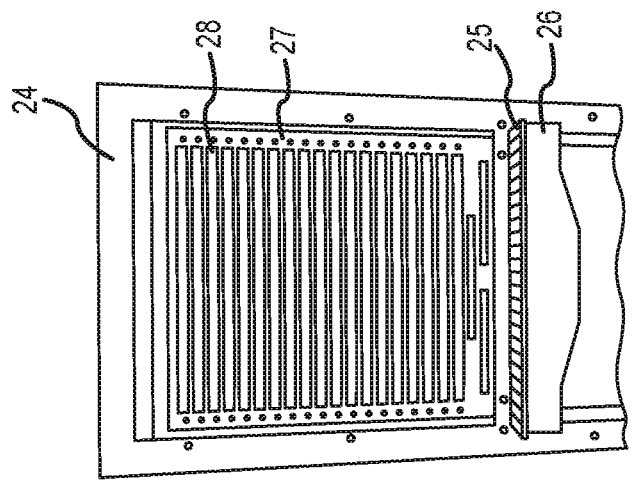
FIG. 2C is an illustration of a front view of a chamber of the pre-baking apparatus shown in FIG. 2B.
Figure 2B:
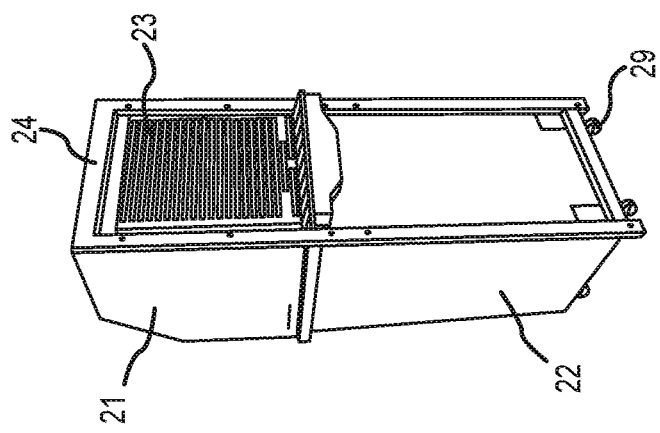
FIG. 2B is an illustration of a front side perspective view of the pre-baking apparatus shown in FIG. 2A.
Figure 2A:
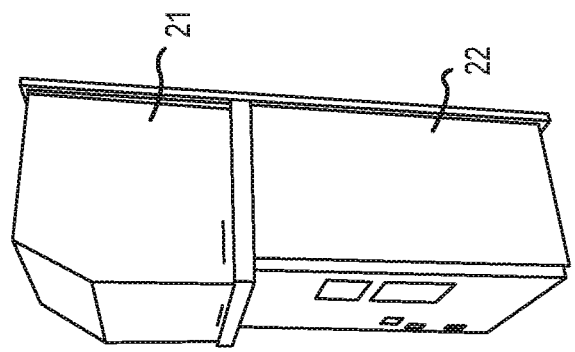
FIG. 2A is an illustration of a rear side perspective view of a pre-baking apparatus according to an embodiment of the present invention.

FIG. 2A is an illustration of a rear side perspective view (the cleanroom side, "C/R Side") of a pre-baking station according to an embodiment of the present invention. FIG. 2B is an illustration of a front side perspective view ("EFEM Side") of the pre-baking station shown in FIG. 2A. FIG. 2C is an illustration of a front view of a chamber of the pre-baking station shown in FIG. 2B. The pre-baking station has a connecting frame 24 for connecting a chamber 27 to the EFEM, wherein the connecting frame 24 is fitted in the BOLTS interface of the EFEM. The chamber 27 is installed inside a housing 21. The pre-baking station is provided with casters 29 at a bottom of a control unit 22 so that the pre-baking station can easily be docked to the EFEM. This pre-baking station includes the control unit 22 for controlling operation of the pre-baking station, which control unit 22 is disposed under the chamber 27 and includes, e.g., a temperature controller, a mass flow controller, etc. The control unit 22 is modularized so that it can be independent from the EFEM (thus, as with the load port, installation of the pre-baking station does not require control modifications of the EFEM). However, the control unit can be provided separately from the chamber 27 or incorporated into the EFEM. The chamber 27 has a front face 23 with multiple slots 28 arranged in a height direction of the chamber, each slot extending from side to side. The pre-baking station further comprises an exhaust duct 26 disposed at a bottom of the chamber 27 and projecting in a direction perpendicular to the front face 23 in a manner discharging through the exhaust duct 26 a hot inert gas flowing out of the multiple slots 28. The exhaust duct 26 has a slit plate 25. In a minienvironment, inert gas constantly blows downward at a flow rate of about 0.8 m/s, and due to the gas flow, the hot inert gas flow is directed downward and readily enters into the exhaust duct 26 and is discharged from the EFEM.

Figure 3:
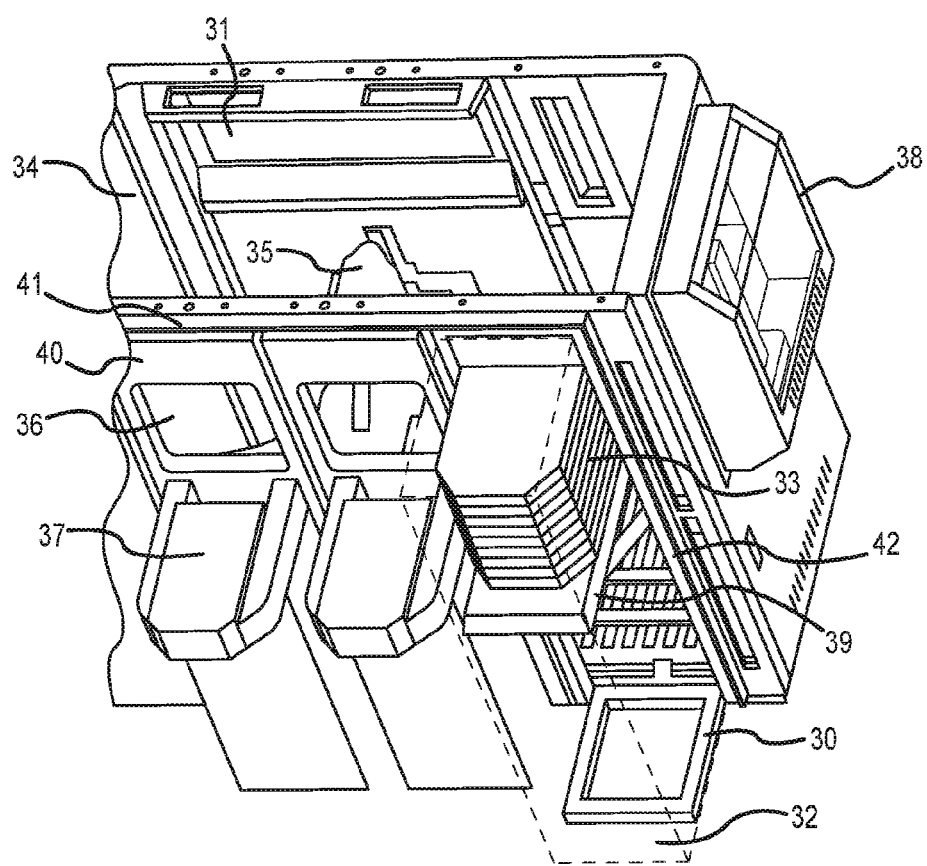
FIG. 3 is a schematic perspective view of a part of an EFEM area according to an embodiment of the present invention, wherein a pre-baking apparatus is shown as if a cover is see-through, and all control equipment provided in the pre-baking apparatus is omitted.

FIG. 3 is a schematic perspective view of a part of an EFEM area according to an embodiment of the present invention, wherein a pre-baking station is shown as if a housing were see-through, and all control equipment provided in the pre-baking apparatus is omitted. In this embodiment, a minienvironment 34 is provided with a robotic arm 35 which transfers a substrate between a process tool and the FOUP. The process tool side (the rear side) of the minienvironment 34 has an interface to which a load lock chamber 31 is connected. The minienvironment 34 is also provided with a cooling station 38 on a side perpendicular to the process tool side. Load ports 40 are fitted to a BOLTS interface 41 of the minienvironment 34 on a front side of the minienvironment 34 opposite to the process tool side. The load port 40 has an opening 36 for transporting substrates between the minienvironment 34 and the FOUP (not shown) installed on a table 37. In this embodiment, a rightmost load port disposed next to the cooling station 38 is replaced with a pre-baking station 32. The pre-baking station comprises a chamber 33 disposed on a table 39 and is provided with casters (not shown) under a bottom frame 30. The pre-baking station has a connecting frame 42 for connecting the chamber 33 to the minienvironment 34. The connecting frame 42 is fitted to the BOLTS interface 41 and can be sealed. Substrates can be transported between the minienvironment 34 and the chamber 33 through the opening 36 in the same manner as that for transporting substrates between the minienvironment 34 and the FOUP using the robotic arm 35. A skilled artisan will appreciate that the apparatus includes one or more controller(s) (not shown) programmed or otherwise configured to cause the transportation of substrates described elsewhere herein to be conducted. The controller(s) are communicated with the various heating systems, pumps, robotics and gas flow controllers or valves or gates, as will be appreciated by the skilled artisan.

In some embodiments, since the pre-baking station is a module, it can readily be retrofitted to an EFEM and facilitate connection to the EFEM. Incidentally, in some embodiments, a FOUP is carried and set in a load port or removed from the load port using an overhead vehicle (OHV), the pre-baking station when installed next to the load port should not interfere with the operation of loading and unloading the FOUP to and from the load port, and thus, the pre-baking station has dimensions such that a clearance between the FOUP and the pre-baking station is sufficient for loading and unloading the FOUP to and from the load port using the OHV.

In another embodiment, the pre-baking station can be disposed independently of the load port and/or at any location as far as the structure of the minienvironment 34 permits.

Figures 4A, 4B:
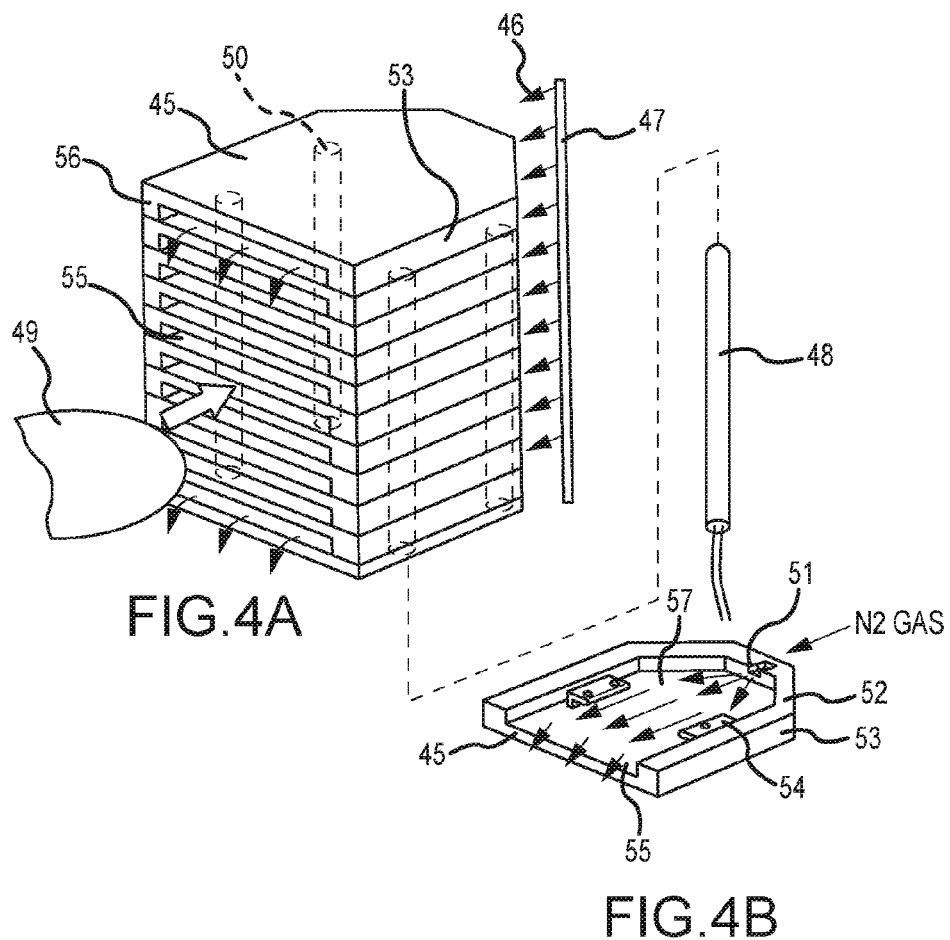
FIG. 4 consists of (a) a schematic representation of a chamber of a pre-baking apparatus, and (b) a schematic representation of a compartment constituting the chamber of the pre-baking apparatus according to an embodiment of the present invention.

FIG. 4 consists of (a) a schematic representation of a chamber of a pre-baking station, and (b) a schematic representation of a compartment constituting the pre-baking chamber according to an embodiment of the present invention. The chamber has a front face 56 with multiple slots 55 arranged in a height direction of the chamber, each slot extending from side to side, and is divided into multiple compartments 57 extending from the multiple slots 55, respectively, toward a rear end of the chamber for loading and unloading substrates 49 to and from the multiple compartments 57 through the multiple slots 55. The multiple compartments are separated from each other by a divider plate 45 and provided with heaters 48 for heating the multiple compartments 57 (the side walls 53 and the rear wall 52 have multiple holes 50 formed in the height direction therethrough, wherein a cartridge heater 48 is inserted in each hole). In some embodiments, the holes 50 formed through the side walls for installing a heater are disposed only near the front face in the side walls.

Each compartment 57 has a gas injection port 51 for blowing a hot inert gas over the substrate placed therein toward the slot 55. Each compartment 57 is defined by adjacent upper and lower divider plates 45, side walls 53, and a rear wall 52 opposite to the slot 55, wherein the gas injection port 51 is disposed in a center of the rear wall 52. In this figure, the divider plate 45 illustrated in (b) in FIG. 4 has side walls 53 and the rear wall 52 formed on top of the divider plate 45, whereas the divider plate 45 illustrated in (a) in FIG. 4 has side walls 53 and the rear wall 52 formed under the divider plate 45, and either one of the types can be used. The configuration of (b), however, is preferable because substrate supports 54 for supporting a substrate 49 thereon can be provided on inner faces of the side walls 53 on a top surface of the divider plate 45. Each compartment 57 is provided with the substrate support 54 on which the substrate 49 is placed in a manner allowing hot inert gas jetting from the gas injection port 51 to flow over both a top side and a reverse side of the substrate. The divider plates 45 can easily be mounted on top of each other using the side walls 53 and the rear walls 52. The divider plates can be made of any suitable materials such as metalized material (aluminum, stainless steel, etc), quartz, ceramics, etc.

In this embodiment, the pre-baking station further comprises a gas manifold 47 extending in the height direction of the chamber, from which gas manifold hot inert gas is supplied to each compartment 57 through each gas injection port 51 via a gas line 46.

In this embodiment, the compartment 57 has a depth sufficient to place the substrate 49 entirely inside the compartment 57. In some embodiments, the depth of the compartment may be about 0% to about 20% longer than the diameter of the substrate, the width of the compartment may be about 10% to about 30% longer than the diameter of the substrate, and the height of the compartment may be about 8 mm to about 15 mm. The number of the compartments are not limited, but it may be in a range of 8 to 19 (typically 12 to 16) in order to improve productivity or throughput. If the number of compartments is increased, a robot Z-axis span (the stroke of a FE RB (front end robot) in the vertical direction) and the time for handling the FE RB may need to be increased, affecting the RR (run rate). Further, the number of compartments cannot be increased beyond the size of the BOLTS interface. In some embodiments, more than one pre-baking station is installed in the EFEM.

In some embodiments, the chamber is not capable of processing the substrate other than pre-baking by the heaters and the hot inert gas, or is configured to solely conduct pre-baking.

FIG. 5 consists of (a) a schematic cross sectional view of a chamber of a pre-baking station, and (b) a schematic enlarged cross sectional view of the area surrounded by a square indicated in (a) according to an embodiment of the present invention. Each compartment 62 has a square hole 64 as a gas injection port in the center of the rear wall. The square hole 64 is connected to a buffer pipe 61 as a gas manifold through a nozzle hole 65. In this embodiment, there is one square hole, but more than one square hole can be provided near the first square hole on the rear wall, and/or on both the side walls. In this embodiment, the size of the square hole is about 3 mm on each side, but it can be selected in a range of about 1 mm to 5 mm, for example. Also in this embodiment, the diameter of the nozzle hole is about 0.5 mm, but it can be selected in a range of about 0.2 mm to 1.0 mm, for example, where the diameter of the nozzle hole is smaller than each side of the square hole. The buffer pipe is disposed vertically between cartridge heaters 63 ((b) shows only one of the cartridge heaters 63).

Figure 6:
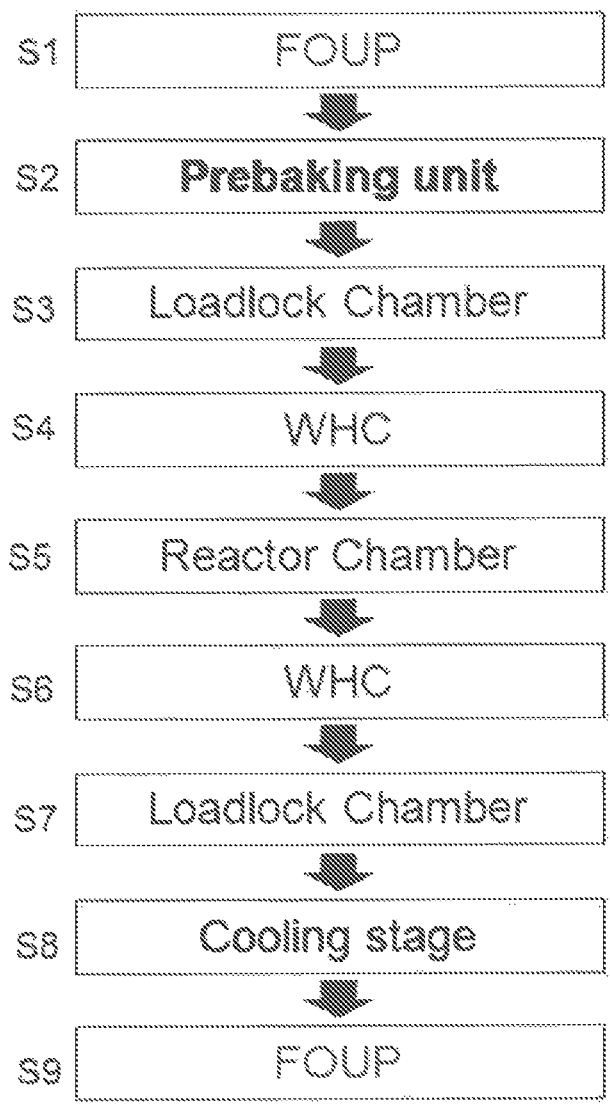
FIG. 6 is a flow chart showing the procedure for processing a substrate starting from a FOUP (front opening unified pod) and ending at a FOUP according to an embodiment of the present invention.

FIG. 6 is a flow chart showing the procedure for processing a substrate starting from a FOUP (front opening unified pod)

and ending at a FOUP according to an embodiment of the present invention. The procedure comprises: taking out a substrate from a FOUP to the minienvironment (S1); inserting the substrate into the pre-baking station (also referred to as "pre-baking unit") to pre-bake the substrate (S2), wherein the compartments of the pre-baking station are heated and a hot inert gas blows through the compartments toward the minienvironment; transporting the pre-baked substrate to a load lock chamber attached to the minienvironment (S3); transporting the pre-baked substrate from the load lock chamber to a wafer handling chamber (WFHC) attached to the load lock chamber (S4); transporting the pre-baked substrate from the WHC to a reactor chamber (S5) to process the pre-baked substrate in the reactor chamber; transporting the processed substrate from the reactor chamber to the WHC (S6); transporting the processed substrate from the WHC to the load lock chamber (S7); inserting the processed substrate into a cooling station (also referred to as a "cooling stage") via the minienvironment (S8) wherein the cooling station is attached to the minienvironment: and placing the cooled processed substrate in the FOUP or another FOUP via the minienvironment (S9).

In some embodiments, in step S2, the hot inert gas blowing through the pre-baking apparatus is $N_2$ gas flowing at a flow rate of about 10 slm to about 40 slm (standard liter/minute) and being heated to about 50° C. to about 150° C. In some embodiments, the compartments of the pre-baking apparatus are heated to about 50° C. to about 150° C.

EXAMPLE 1

Figure 7:
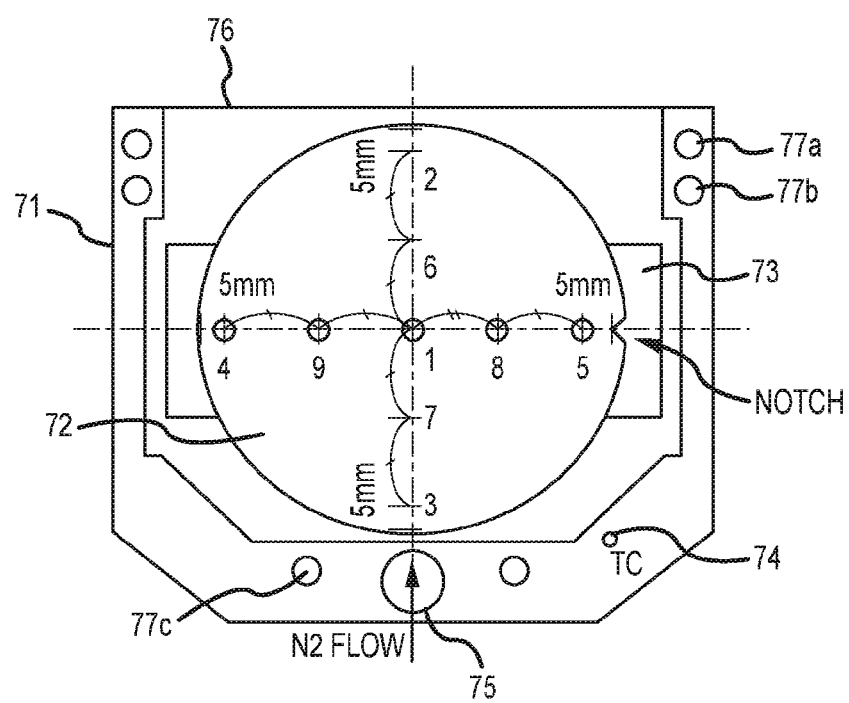
FIG. 7 is a schematic plan view of a compartment showing measurement positions of temperature on a substrate according to an embodiment of the present invention.

Temperature distributions inside a pre-baking station illustrated in FIGS. 2A to 2C, 4, and 5, attached to a minienvironment illustrated in FIG. 3, were evaluated. FIG. 7 is a schematic plan view of a compartment showing temperature-measurement positions on a substrate (a 300-mm wafer). A first cartridge heater 77a was installed in each side wall near the slit 76 (front opening), a second cartridge heater 77b (having a higher heat capacity than the first cartridge heater) was installed in each side wall behind the first cartridge heater 77a, and a third cartridge heater 77c (having the same heat capacity as the first cartridge heater) was installed in the rear wall next to a $N_2$ gas buffer pipe 75 on both sides. The set temperature of the cartridge heaters was 100° C. A heated nitrogen gas (the temperature was set at 100° C. at a $N_2$ heat exchanger) was introduced into the compartment from the center of the rear wall through a square nozzle at 30 SLM. A thermocouple (TC) 74 was installed in the rear wall for controlling temperature. In addition, the chamber can be provided with an over-temperature TC in the rear wall so that when overheating is detected, the system can be shut down. The pressure in the compartment was atmospheric pressure. A wafer was placed inside the compartment on wafer supports, and the dimensions of the compartment were 11.5 mm in height, 320 mm in width, and 339 mm in depth. Temperatures at locations 1 to 9 on the wafer shown in FIG. 7 were measured 240 to 300 seconds after the wafer was loaded (upper slots required less time to reach the set temperature than lower slots). The above temperature measurement was conducted on compartments of slot Nos. 1, 5, 9, 13, 18, and 19.

Figure 8:
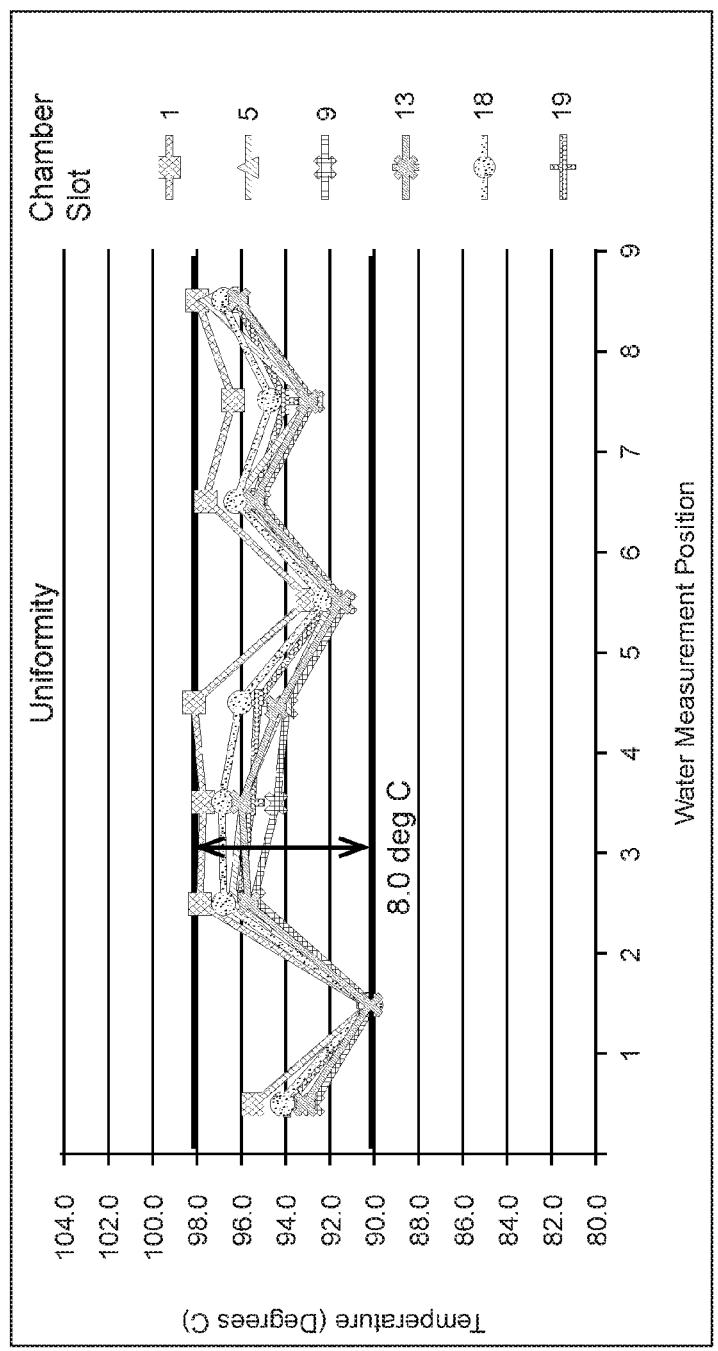
FIG. 8 is a graph showing temperatures at the measurement positions of different compartments according to an embodiment of the present invention.

FIG. 8 is a graph showing temperatures at the measurement positions of the different compartments. As can be seen from FIG. 8, all of the measured temperatures were between 90.0° C. and 98.0° C., i.e., in-plane temperature variations and slot-to-slot temperature variations were significantly low, and uniform heating was achieved.

EXAMPLE 2

A run rate (throughput: the number of wafers processed per hour), RR, was estimated using a system substantially similar to that used in Example 1 by simulation. The conditions for the simulation were as follows:

Loading pattern: Cascade (from one FOUP, loading a wafer to a front end robot (FE RB; an atmospheric robot), loading a wafer to a load lock chamber, loading a wafer to a back end robot (BE RB; a vacuum robot), loading a wafer to each of multiple reaction chambers are conducted simultaneously, for processing);

The number of slots of the pre-baking station: 12;

The duration of pre-baking at the pre-baking station: 200 seconds;

Platform: Pentagonal WHC with four process modules each having two reactors (single-wafer batch processing) and two load lock chambers;

Pre-baking operation: Three conditions (no pre-baking; pre-baking in a reaction chamber; pre-baking in an EFEM); and Thickness of film deposited: Two conditions (100 Å; 320 Å).

The resultant run rates (RR) are shown in Table 2 below.

TABLE 2

| Film thickness | No Prebaking | Prebaking in RC | Prebaking in EFEM |
|---|---|---|---|
| 100A | 191.2 | 79.7 | 160.9 |
| 320A | 102.2 | 58.5 | 102.2 |

As shown in Table 2, the RR was significantly improved by performing pre-baking in the EFEM, but not in the RC. The RR improvement was more significant for thick layer deposition, and the pre-baking did not reduce the RR at all. However, for thin layer deposition, although the RR was improved, the pre-baking still reduced the RR, i.e., 12 slots appear not to be sufficient for thin layer deposition.

By increasing the number of slots provided in the pre-baking station, or by using another pre-baking station in the EFEM, the pre-baking station will no longer be a RR limiting factor even for thin layer deposition as shown in Table 3 below.

TABLE 3

| Film thickness | No Prebaking | 12 slots | 16 slots |
|---|---|---|---|
| 100A | 191.2 | 160.9 | 191.2 |
| 320A | 102.2 | 102.2 | 102.2 |

As shown in Table 3, by increasing the number of slots, the RR was increased even for thin layer deposition. However, if the number of slots is increased, the robot Z-axis span (the stroke of the FE RB in the vertical direction) and the time for handling the FE RB may need to be increased, affecting the RR.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A pre-baking apparatus for heating a substrate upstream of a process tool, comprising:
   a chamber which has a front face with multiple slots arranged in a height direction of the chamber, each slot extending from side to side, and which is divided into multiple compartments extending from the multiple slots, respectively, toward a rear end of the chamber for loading and unloading substrates to and from the multiple compartments through the multiple slots, said multiple compartments being separated from each other by a divider plate and provided with heaters for heating the multiple compartments, each compartment having a gas injection port for blowing a hot inert gas over the substrate placed therein toward the slot; and
   a connecting frame for connecting the chamber to the process tool.

2. The pre-baking apparatus according to claim 1, wherein the connecting frame is configured to connect the chamber to an EFEM (equipment front end module) connected to the process tool.

3. The pre-baking apparatus according to claim 2, which is modularized and operable independently of the EFEM.

4. The pre-baking apparatus according to claim 2, wherein the connecting frame has a structure to be attached to an interface for mechanically attaching a load port to the EFEM.

5. The pre-baking apparatus according to claim 1, wherein each compartment is provided with a substrate support on which the substrate is placed in a manner allowing the hot inert gas to flow over both a top side and a reverse side of the substrate.

6. The pre-baking apparatus according to claim 1, wherein each compartment is defined by adjacent upper and lower divider plates, side walls, and a rear wall opposite to the slot, wherein the gas injection port is disposed in a center of the rear wall.

7. The pre-baking apparatus according to claim 6, wherein the multiple compartments have multiple holes formed in the height direction through the side walls and through the rear wall, wherein a cartridge heater is inserted in each hole.

8. The pre-baking apparatus according to claim 7, wherein the holes formed through the side walls are disposed only near the front face in the side walls.

9. The pre-baking apparatus according to claim 1, wherein the compartment has a depth sufficient to place the substrate entirely inside the compartment.

10. The pre-baking apparatus according to claim 1, wherein the chamber is not capable of processing the substrate other than pre-baking by the heaters and the hot inert gas.

11. The pre-baking apparatus according to claim 1, further comprising an exhaust duct disposed at a bottom of the chamber and projecting in a direction perpendicular to the front face in a manner discharging through the exhaust duct the hot inert gas flowing out of the multiple slots.

12. The pre-baking apparatus according to claim 1, further comprising a gas manifold extending in the height direction of the chamber, from which gas manifold the hot inert gas is supplied to each compartment through each gas injection port.

13. The pre-baking apparatus according to claim 1, further comprising a control unit including a gas supply system for heating an inert gas upstream of the gas injection ports and supplying the heated inert gas as the hot inert gas to the gas injection ports.

14. The pre-baking apparatus according to claim 13, wherein the control unit is disposed under the chamber and has casters at a bottom of the control unit.

15. An EFEM (equipment front end module) area for a process tool for processing substrates, comprising:
    a minienvironment which is a zone cleaner than a cleanroom and is configured to be connected to the process tool, said minienvironment having interfaces for mechanically attaching thereto at least one load port with a FOUP (front opening unified pod) for storing unprocessed and processed substrates and a cooling station for cooling substrates before storing processed substrates in the FOUP;
    a load port with a FOUP mechanically attached to one of the interfaces; and
    at least one pre-baking apparatus of claim 1 mechanically attached to another of the interfaces.

16. The EFEM area according to claim 15, wherein the interfaces include two or more interfaces each for mechanically attaching one load port with a FOUP to the minienvironment and one interface for mechanically attaching a cooling station to the minienvironment, wherein the load port is attached to one of the two or more interfaces, and the pre-baking apparatus is attached to another of the two or more interfaces, and the EFEM area further comprises a cooling station attached to the interface for a cooling station.

17. A method for processing a substrate using a process tool with an EFEM area of claim 13, said method comprising:
    taking out a substrate from the FOUP to the minienvironment;
    inserting the substrate into the pre-baking apparatus to pre-bake the substrate, wherein the compartments of the pre-baking apparatus are heated and a hot inert gas blows through the compartments toward the minienvironment;
    inserting the pre-baked substrate into the process tool via the minienvironment;
    processing the pre-baked substrate in the process tool; and
    placing the processed substrate in the FOUP or another FOUP via the minienvironment.

18. The method according to claim 17, wherein a cooling station is attached to the EFEM area and the method further comprises inserting the processed substrate into the cooling station before placing the processed substrate in the FOUP or another FOUP.

19. The method according to claim 17, wherein the hot inert gas blowing through the pre-baking apparatus is $N_2$ gas flowing at a flow rate of about 10 slm to about 40 slm (standard liter/minute) and being heated to about 50° C. to about 150° C.

20. The method according to claim 17, wherein the compartments of the pre-baking apparatus are heated to about 50° C. to about 150° C.

* * * * *